(12) United States Patent
Yu

(10) Patent No.: US 9,537,115 B2
(45) Date of Patent: Jan. 3, 2017

(54) ORGANIC LIGHT EMITTING DIODE PACKAGE STRUCTURE AND DISPLAY DEVICE

(71) Applicant: SHENZHEN CHINA STAR OPTOELECTRONICS TECHNOLOGY CO., LTD, Shenzhen (CN)

(72) Inventor: Wei Yu, Shenzhen (CN)

(73) Assignee: SHENZHEN CHINA STAR OPTOELECTRONICS TECHNOLOGY CO., LTD, Shenzhen (CN)

(*) Notice: Subject to any disclaimer, the term of this patent is extended or adjusted under 35 U.S.C. 154(b) by 182 days.

(21) Appl. No.: 14/401,847

(22) PCT Filed: Sep. 23, 2014

(86) PCT No.: PCT/CN2014/087184
§ 371 (c)(1),
(2) Date: Nov. 18, 2014

(87) PCT Pub. No.: WO2016/033845
PCT Pub. Date: Mar. 10, 2016

(65) Prior Publication Data
US 2016/0268548 A1    Sep. 15, 2016

(30) Foreign Application Priority Data
Sep. 3, 2014 (CN) ............................ 2014 1 0446082

(51) Int. Cl.
*H01L 51/52* (2006.01)
*H01L 27/32* (2006.01)

(52) U.S. Cl.
CPC .......... *H01L 51/5259* (2013.01); *H01L 27/32* (2013.01); *H01L 51/52* (2013.01); *H01L 51/5246* (2013.01);
(Continued)

(58) Field of Classification Search
USPC .................................................. 313/498–512
See application file for complete search history.

(56) References Cited

U.S. PATENT DOCUMENTS 7,535,172 B2 * 5/2009 Ahn ...................... H01L 51/524
313/504
2007/0176549 A1 8/2007 Park
(Continued)

FOREIGN PATENT DOCUMENTS

CN  1909163 A    2/2007
CN  101009319 A  8/2007
(Continued)

*Primary Examiner* — Ashok Patel
(74) *Attorney, Agent, or Firm* — Mark M. Friedman

(57) ABSTRACT

An OLED package structure and a display device are provided. The OLED package structure has an OLED substrate including an OLED component; and a package substrate including an active metal film. A sealed chamber is formed by using a sealant to bond the OLED substrate and the package substrate, and the OLED component and the active metal film are positioned in the sealed chamber. The life time of the OLED component and the display device can be increased by absorbing residual oxygen in the package structure and external penetrating oxygen.

4 Claims, 2 Drawing Sheets

(52) U.S. Cl.
CPC .... *H01L 2251/301* (2013.01); *H01L 2251/303* (2013.01)

(56) References Cited

U.S. PATENT DOCUMENTS

| | | | |
|---|---|---|---|
| 2010/0201261 A1* | 8/2010 | Kwack | H01L 51/5237 313/504 |
| 2010/0294024 A1 | 11/2010 | Kumar et al. | |
| 2012/0153814 A1* | 6/2012 | Lee | H01L 51/524 313/504 |
| 2014/0232258 A1* | 8/2014 | Oh | H01L 51/5259 313/504 |
| 2014/0329342 A1 | 11/2014 | Zeng | |

FOREIGN PATENT DOCUMENTS

| | | |
|---|---|---|
| CN | 103217459 A | 7/2013 |
| WO | 2008082362 A1 | 7/2008 |

* cited by examiner

ORGANIC LIGHT EMITTING DIODE PACKAGE STRUCTURE AND DISPLAY DEVICE

FIELD OF THE INVENTION

The present invention relates to a technical field of displays, and in particular to an OLED (Organic Light Emitting Diode) package structure and display device.

BACKGROUND OF THE INVENTION

OLED devices have become a very competitive and promising next-generation display technology due to the following advantages: a full solid-state structure, a high brightness, a wide view angle, and a fast response speed. OLED devices have become a very competitive and promising next-generation display technology.

Referring to FIG. 1, an organic thin film of an OLED component 11 is produced on an OLED substrate 12, and the organic thin film is disposed between a cathode metal and an anode metal. The organic thin film is lighted by applying voltage to the cathode metal and the anode metal. The organic thin film is sensitive to vapor and oxygen, and the brightness and life time will be significantly attenuated by vapor and oxygen. Therefore, the OLED component 11 must be packaged. FIG. 1 is a schematic view of a traditional OLED package structure, a cover of the package structure generally is made from a glass substrate 13. Then a sealant 14 is coated on an edge of the two substrates, and the substrates are aligned and sealed with each other to form a sealed chamber, and the OLED component 11 is positioned in the sealed chamber.

Referring to FIG. 1, a desiccant 15 is typically added in the sealed chamber to increase the life time of the OLED component 11, but the desiccant 15 only eliminates the vapor, and the OLED component 11 is still oxidized by the oxygen. Thus, once the desiccant 15 is added in the sealed chamber, the oxygen cannot be eliminated in the sealed chamber or from outside.

SUMMARY OF THE INVENTION

A primary object of the present invention is to provide an OLED package structure and a display device, which reduces a surface roughness of the poly silicon thin film from a low-temperature preparation, and improves the crystallization effect.

To achieve the above objects, the present invention provides an OLED package structure which comprises an OLED substrate including an OLED component, wherein the OLED component is disposed on a surface of the OLED substrate; and a package substrate including an active metal film for absorbing oxygen in the package structure, wherein the active metal film is disposed on a surface of the package substrate, and at least one irregular protrusion is formed on a surface of the active metal film, and the active metal film is a copper film; wherein a sealed chamber is formed by using a sealant to bond the OLED substrate and the package substrate, and the OLED component and the active metal film are positioned in the sealed chamber.

In one embodiment of the present invention, the active metal film comprises at least one active metal block, and at least one irregular protrusion is formed on a surface of the active metal block.

In one embodiment of the present invention, a desiccant layer is disposed on the active metal film for absorbing vapor in the package structure.

In one embodiment of the present invention, the desiccant layer comprises at least one of calcium oxide or strontium oxide.

To achieve the above objects, the present invention provides an OLED package structure which comprises an OLED substrate including an OLED component, wherein the OLED component is disposed on a surface of the OLED substrate; and a package substrate including an active metal film for absorbing oxygen in the package structure; wherein a sealed chamber is formed by using a sealant to bond the OLED substrate and the package substrate, and the OLED component and the active metal film are positioned in the sealed chamber.

In one embodiment of the present invention, at least one irregular protrusion is formed on a surface of the active metal film.

In one embodiment of the present invention, the active metal film comprises at least one active metal block, and at least one irregular protrusion is formed on a surface of the active metal block.

In one embodiment of the present invention, a desiccant layer is disposed on the active metal film for absorbing vapor in the package structure.

In one embodiment of the present invention, the desiccant layer comprises at least one of calcium oxide or strontium oxide.

In one embodiment of the present invention, the active metal film is a copper film.

To achieve the above objects, the present invention provides a display device which comprises an OLED package structure. The OLED package structure comprises an OLED substrate including an OLED component, wherein the OLED component is disposed on a surface of the OLED substrate; and a package substrate including an active metal film for absorbing oxygen in the package structure; wherein a sealed chamber is formed by using a sealant to bond the OLED substrate and the package substrate, and the OLED component and the active metal film are positioned in the sealed chamber.

In one embodiment of the present invention, the active metal film comprises at least one active metal block, and at least one irregular protrusion is formed on a surface of the active metal block.

In one embodiment of the present invention, a desiccant layer is disposed on the active metal film for absorbing vapor in the package structure.

In one embodiment of the present invention, the desiccant layer comprises at least one of calcium oxide or strontium oxide.

Compared with the prior art, the present invention provides the OLED package structure and the display device. A sealed chamber is formed by using a sealant to bond the OLED substrate and the package substrate, and the OLED component is positioned in the sealed chamber. The sealed chamber further comprises the active metal film for absorbing oxygen in the package structure.

DESCRIPTION OF THE DRAWINGS

The present invention is described in detail below by way of specific embodiments in conjunction with the accompanying drawings. The present invention will enable technology and other beneficial effects which are obvious.

DETAILED DESCRIPTION OF THE PREFERRED EMBODIMENTS

Please refer to the drawings, wherein the present invention is implemented in a suitable computing environment by way of example, and similar components are represented by the same symbols. The following description is based on the specific illustrated embodiment of the present invention, which should not be construed as limiting the present invention; this is not discussed in detail in other specific embodiments.

Figure 1:
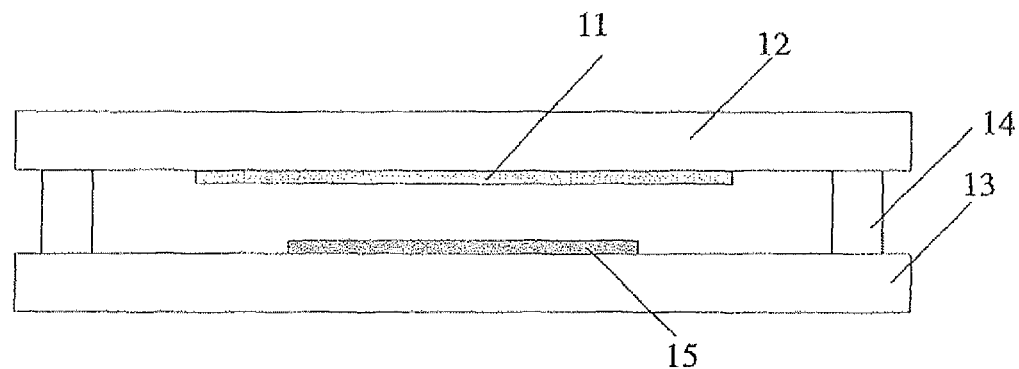
FIG. 1 is a schematic view of a traditional OLED package structure.

Referring to FIG. 1, an OLED package structure according to an embodiment of the present invention is illustrated. As shown in FIG. 1, the OLED package structure comprises an OLED substrate 22 and a package substrate 23.

The OLED substrate 22 includes an OLED component 21, and the OLED component 21 is disposed on a surface of the OLED substrate 22. The package substrate 23 includes an active metal film 25 for absorbing oxygen in the package structure 23, and a sealed chamber is formed by using a sealant 24 to bond the OLED substrate 22 and the package substrate 23, and the OLED component 21 and the active metal film 25 are positioned in the sealed chamber.

The OLED component 21 is disposed on the surface of the OLED substrate 22 and positioned in the sealed chamber, and the OLED component 21 comprises a cathode metal, an anode metal, and a plurality of organic thin films. The organic thin films are lighted by applying voltage to the cathode metal and the anode metal.

The edges of the OLED substrate 22 and the package substrate 23 are bonded to each other by the sealant 24, so that the sealed chamber is formed from the OLED substrate 22, package substrate 23, and the sealant 24, and the sealed chamber is considered to be inside the package structure. The sealed chamber further comprises the active metal film 25, and the active metal film 25 is disposed on the surface of the package substrate 23 for absorbing oxygen gas in the package structure. Thus, the active metal film 25 can absorb residual oxygen in the package structure and external penetrating oxygen. Oxygen can be separated.

In the embodiment, the OLED substrate 22 and the package substrate 23 are glass substrates. Preferably, the sealant 24 is a UV (Ultraviolet Rays) sealant, also known as a photoresist or UV curing adhesive. The OLED substrate 22 and the package substrate 23 are bonded by the sealant 24 UV sealant after aligning the OLED substrate 22 and the package substrate 23. The UV sealant can be solidified cured by emitting UV rays to seal the OLED substrate 22 and the package substrate 23.

Preferably, the active metal film 25 can be sputtered by PVD (Physical Vapor Deposition). At least one irregular protrusion is formed on a surface of the active metal film 25 for increasing the surface area of the active metal film 25 to react with oxygen effectively, and an irregular protrusion is formed by using a photolithographic/etching process.

Figure 3:
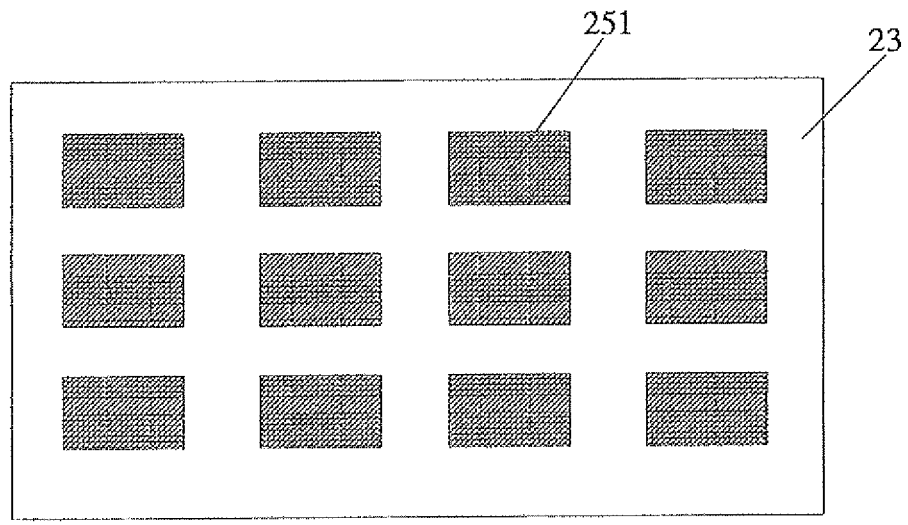
FIG. 3 is another schematic view of an OLED package structure according to an embodiment of the present invention.
Figure 4:
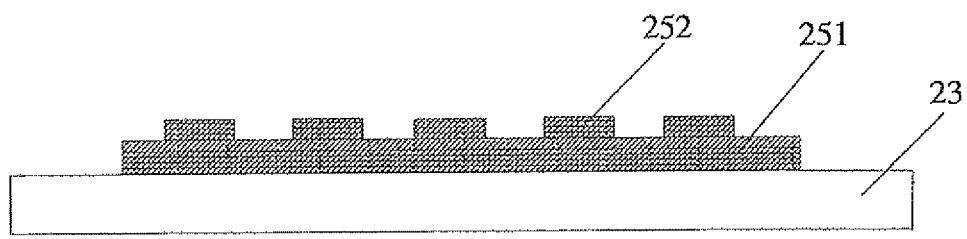
FIG. 4 is another schematic view of an OLED package structure according to an embodiment of the present invention.

FIG. 3 is a schematic view of an active metal film 25. The active metal film 25 comprises at least one active metal block 251, so that the active metal film 25 comprises a plurality of metal patterns reacted with oxygen. FIG. 4 is another schematic view of an active metal film 25. At least one irregular protrusion 252 is formed on a surface of each active metal block 251. The irregular protrusions 252 are disposed for increasing the surface area of each metal pattern to react with oxygen effectively, and the irregular protrusions are formed by using a photolithographic/etching process.

The size of the metal pattern can be adjusted and determined according to the dimensions of the practical application of the OLED package structure, and is not particularly limited herein.

The active metal film 25 is also an aluminum film, a copper film, or a silver film. The active metal film 25 is preferably a copper film in the embodiment of the invention. The reaction principle of the copper film and oxygen is $2Cu+O_2=2CuO$.

As stated above, the present invention provides an OLED package structure and a display device, wherein the sealed chamber is formed by using a sealant 24 to bond the OLED substrate 22 and the package substrate 23, and the OLED component 21 is positioned in the sealed chamber. The sealed chamber further comprises the active metal film 25, and the active metal film 25 can absorb residual oxygen in the package structure and external penetrating oxygen. Thus, the oxygen permeability of the OLED component can be reduced, the OLED component can avoid oxidizing, and the life time of the OLED component and the display device can be increased.

As a more preferred embodiment, the active metal film 25 may also dispose a desiccant layer (not shown) for absorbing vapor in the package structure, and the desiccant layer comprises at least one of calcium oxide or strontium oxide.

The desiccant layer can be made from desiccant particles, and the desiccant particles can be embodied as a spherical desiccant. The diameter of the spherical desiccant is between 0.04 to 0.07 mm, and the size of the spherical desiccant can be adjusted and determined according to the dimensions of the practical application of the OLED package structure, and is not particularly limited herein.

As stated above, the present invention provides an OLED package structure, wherein the sealed chamber is formed by using a sealant 24 to bond the OLED substrate 22 and the package substrate 23, and the OLED component 21 is positioned in the sealed chamber. The sealed chamber further comprises the active metal film 25, and the active metal film 25 can absorbs residual oxygen in the package structure and external penetrating oxygen. Preferably, the sealed chamber further comprises a desiccant layer, and the desiccant layer can absorb oxygen and vapor in the package structure. Thus, the oxygen permeability of the OLED component can be reduced, the OLED component can avoid oxidizing, and the life time of the OLED component and the display device can be increased.

In a further embodiment of the present invention to provide the OLED package structure, a display device is provided, and the display device comprises the OLED package structure. Wherein the meanings of the terms in the same OLED package structure are as described above, and the specific implementation details can be described with reference to the OLED package structure of the previous example.

Figure 2:
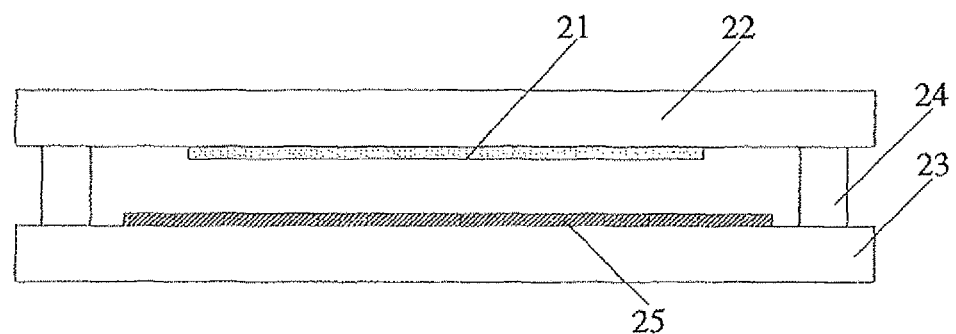
FIG. 2 is a schematic view of an OLED package structure according to an embodiment of the present invention.
Figure 5:
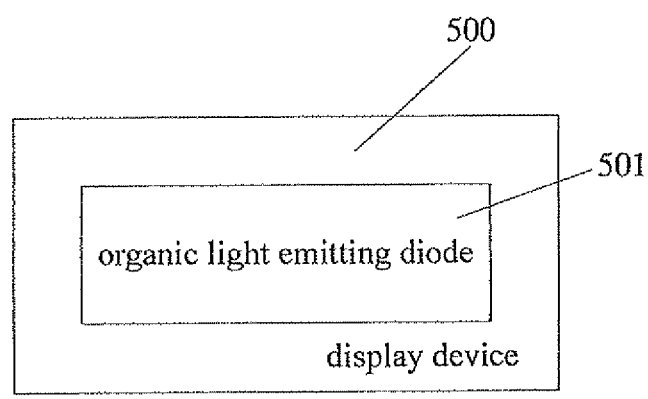
FIG. 5 is a schematic view of a display device according to an embodiment of the present invention.

FIG. 5 is a schematic view of a display device 500 of the embodiment of the present invention. The display device 500 comprises an OLED package structure 501, wherein the OLED package structure 501 of the above-described embodiments provide the OLED package structure by reference to FIG. 2 to FIG. 4. The OLED package structure 501 comprises an OLED substrate 22 and a package substrate 23.

The OLED substrate 22 includes an OLED component 21, and the OLED component 21 is disposed on a surface of the OLED substrate 22. The package substrate 23 includes an active metal film 25 for absorbing oxygen in the package structure 23, and a sealed chamber is formed by using a sealant 24 to bond the OLED substrate 22 and the package substrate 23, and the OLED component 21 and the active metal film 25 are positioned in the sealed chamber.

The OLED component 21 is disposed on the surface of the OLED substrate 22 and positioned in the sealed chamber, and the OLED component 21 comprises a cathode metal, an anode metal, and a plurality of organic thin films. The organic thin films are lighted by applying voltage to the cathode metal and the anode metal.

The edges of the OLED substrate 22 and the package substrate 23 are bonded by the sealant 24, so that the sealed chamber is formed from the OLED substrate 22, package substrate 23, and the sealant 24, and the sealed chamber is considered to be inside the package structure. The sealed chamber further comprises the active metal film 25, and the active metal film 25 is disposed on the surface of the package substrate 23 for absorbing oxygen in the package structure. Thus, the active metal film 25 can absorb residual oxygen in the package structure and external penetrating oxygen. Oxygen can be separated.

In the embodiment, the OLED substrate 22 and the package substrate 23 are glass substrates. Preferably, the sealant 24 is a UV (Ultraviolet Rays) sealant, also known as a photoresist or UV curing adhesive. The OLED substrate 22 and the package substrate 23 are bonded by the sealant 24 UV sealant after aligning the OLED substrate 22 and the package substrate 23. The UV sealant can be solidified by irradiating with UV light to seal the OLED substrate 22 and the package substrate 23.

Preferably, the active metal film 25 can be sputtered by PVD (Physical Vapor Deposition). At least one irregular protrusion is formed on a surface of the active metal film 25 for increasing the surface area of the active metal film 25 to react with oxygen effectively, and the irregular protrusion is formed by using a photolithographic/etching process.

FIG. 3 is a schematic view of an active metal film 25. The active metal film 25 comprises at least one active metal block 251, so that the active metal film 25 comprises a plurality of metal patterns reacted with oxygen. FIG. 4 is another schematic view of an active metal film 25. At least one irregular protrusion 252 is formed on a surface of each active metal block 251. The irregular protrusions 252 are disposed for increasing the surface area of each metal pattern to react with oxygen effectively, and the irregular protrusions are formed by using a photolithographic/etching process.

The size of the metal pattern can be adjusted and determined according to the dimensions of the practical application of the OLED package structure, and is not particularly limited herein.

The active metal film 25 is also an aluminum film, a copper film, or a silver film. The active metal film 25 is preferably a copper film in the embodiment of the invention. The reaction principle of the copper film and oxygen is $2Cu+O_2=2CuO$.

As a more preferred embodiment, the active metal film 25 can also dispose a desiccant layer (not shown) for absorbing vapor in the package structure, and the desiccant layer comprises at least one of calcium oxide or strontium oxide.

The desiccant layer can be made from desiccant particles, and the desiccant particles can be embodied as a spherical desiccant. The diameter of the spherical desiccant is between 0.04 to 0.07 mm, and the size of the spherical desiccant can be adjusted and determined according to the dimensions of the practical application of the OLED package structure, and is not particularly limited herein.

As stated above, the present invention provides the display device 500, wherein the sealed chamber is formed by using a sealant 24 to bond the OLED substrate 22 and the package substrate 23, and the OLED component 21 is positioned in the sealed chamber. The sealed chamber further comprises the active metal film 25, and the active metal film 25 can absorb residual oxygen in the package structure and external penetrating oxygen. Preferably, the sealed chamber further comprises a desiccant layer, and the desiccant layer can absorb oxygen and vapor in the package structure. Thus, the oxygen permeability of the OLED component can be reduced, the OLED component can avoid oxidizing, and the life time of the OLED component and the display device can be increased.

In the above embodiment, the description of various embodiments have focused on a certain embodiment is not described in detail section, you can see the relevant description in other embodiments.

Furthermore, the word "preferably" used herein means serving as an example, a sample, or an illustration. Text described as "preferred" in any aspect or design is not necessarily to be construed as advantageous over other aspects or designs. In contrast, the term "preferred", is meant in the particular way of the concept. As used herein, the term "or" is intended to mean the inclusive "or", not the exclusive "or." That is, unless specified otherwise, or clear from the context, "X employs A or B" means an arrangement of any nature which is inclusive. That is, if X employs A; X employs B; or X employs both A and B, then "X employs A or B" is met in any of the foregoing examples.

Moreover, despite being disclosed as one or more implementations shown and described the present disclosure, equivalent variations and modifications will occur to those skilled in the art upon reading and understanding the present specification and drawings. The present disclosure includes all such modifications and variations, and is only limited by the scope of the appended claims. Particularly, with regard to the various functions performed by the above-described components (e.g., elements, resources, etc.), the terms used to describe such components are intended to perform the function corresponding to the specified component (e.g., which are functionally equivalent) of any of the components (unless otherwise indicated), even if the structure of the implementation and execution of the function of the present disclosure shown herein is not structurally equivalent. Additionally, although a particular feature of the present disclosure has been made with respect to certain implementations, only one is open, but this feature may be as given or particular application and the purpose of enabling a desired one or more other implementations Other combinations of features. Moreover, the terms "comprising", "having", "containing", or variants thereof are used in the detailed description or the claims, and such terms are intended to be used in a manner similar to the term "comprising".

Although the present invention has been disclosed in the preferred embodiments described above, the foregoing preferred embodiments are not intended to limit the present invention. One of ordinary skill in the art, without departing from the spirit and scope of the present invention, may make modifications and variations, so the scope of the protection of the invention is defined by the claims.

What is claimed is:

1. An organic light emitting diode (OLED) package structure, comprising:
    an OLED substrate including an OLED component, wherein the OLED component is disposed on a surface of the OLED substrate; and
    a package substrate including an active metal film for absorbing oxygen in the package structure, wherein the active metal film is disposed on a surface of the package substrate, and at least one irregular protrusion is formed on a surface of the active metal film, and the active metal film is a copper film;
    wherein a sealed chamber is formed by using a sealant to bond the OLED substrate and the package substrate, and the OLED component and the active metal film are positioned in the sealed chamber;
    wherein the active metal film comprises at least one active metal block, and at least one irregular protrusion is formed on a surface of the active metal block; and a desiccant layer is disposed on the active metal film for absorbing vapor in the package structure, the desiccant layer is made from a spherical desiccant, and the diameter of a particle of the spherical desiccant is between 0.04 to 0.07 mm.

2. The OLED package structure according to claim 1, wherein the desiccant layer comprises at least one of calcium oxide or strontium oxide.

3. A display device comprising an OLED package structure, wherein the OLED package structure comprises:
    an OLED substrate including an OLED component, wherein the OLED component is disposed on a surface of the OLED substrate; and
    a package substrate including an active metal film for absorbing oxygen in the package structure;
    wherein a sealed chamber is formed by using a sealant to bond the OLED substrate and the package substrate, and the OLED component and the active metal film are positioned in the sealed chamber;
    wherein the active metal film comprises at least one active metal block, and at least one irregular protrusion is formed on a surface of the active metal block; and a desiccant layer is disposed on the active metal film for absorbing vapor in the package structure, the desiccant layer is made from a spherical desiccant, and the diameter of a particle of the spherical desiccant is between 0.04 to 0.07 mm.

4. The display device according to claim 3, wherein the desiccant layer comprises at least one of calcium oxide or strontium oxide.

* * * * *